United States Patent
Kaneko

(10) Patent No.: US 8,565,001 B2
(45) Date of Patent: Oct. 22, 2013

(54) METHOD FOR OPERATING A NONVOLATILE SWITCHING DEVICE

(75) Inventor: Yukihiro Kaneko, Osaka (JP)

(73) Assignee: Panasonic Corporation, Osaka (JP)

( * ) Notice: Subject to any disclaimer, the term of this patent is extended or adjusted under 35 U.S.C. 154(b) by 258 days.

(21) Appl. No.: 13/240,225

(22) Filed: Sep. 22, 2011

(65) Prior Publication Data

US 2012/0008365 A1    Jan. 12, 2012

Related U.S. Application Data

(63) Continuation of application No. PCT/JP2011/001671, filed on Mar. 22, 2011.

(30) Foreign Application Priority Data

May 26, 2010    (JP) ................................ 2010-120017

(51) Int. Cl.
*G11C 11/22*    (2006.01)

(52) U.S. Cl.
USPC ............................ 365/145; 365/117; 365/65

(58) Field of Classification Search
USPC ............................................ 365/145, 117, 65
See application file for complete search history.

(56) References Cited

U.S. PATENT DOCUMENTS

| | | | |
|---|---|---|---|
| 7,948,789 B2 * | 5/2011 | Muraoka et al. | 365/148 |
| 2009/0097299 A1 | 4/2009 | Tanaka et al. | |

* cited by examiner

*Primary Examiner* — Son Dinh
*Assistant Examiner* — Nam Nguyen
(74) *Attorney, Agent, or Firm* — McDermott Will & Emery LLP

(57) ABSTRACT

A method of flowing a current selectively with a nonvolatile switching device according to the present disclosure includes a step of configuring, in the nonvolatile switching device, any one of a first state in which a current does not flow between the electrode group, a second state in which a current flows selectively between the first electrode and the second electrode, and a third state in which a current flows selectively between the first electrode and the third electrode. When any one of the first state, the second state and the third state is configured, voltages V1, Va, Vb and Vc, which satisfy predetermined inequality set corresponding to the one of the first to third states, are applied to the control electrode, the first electrode, the second electrode, and the third electrode, respectively.

7 Claims, 10 Drawing Sheets

|  | Resistance values between electrodes (MΩ) | | |
| --- | --- | --- | --- |
|  | between 15 and 16 | between 15 and 17 | between 15 and 18 |
| First state | 242.7 | 1350 | 180.2 |
| Second state | 2.737 | 2579 | 256.2 |
| Third state | 326.2 | 10.12 | 231.1 |
| Sixth state | 279.0 | 2206 | 31.52 |

Fig. 7

PRIOR ART

METHOD FOR OPERATING A NONVOLATILE SWITCHING DEVICE

RELATED APPLICAIONS

This application is a continuation of PCT International Application PCT/JP2011/001671 filed on Mar. 22, 2011, which claims priority to Japanese Patent Application No. 2010-120017 filed on May 26, 2010. The disclosures of these applications including the specifications, the drawings, and the claims are hereby incorporated by reference in their entirety.

TECHNICAL FIELD

The present disclosure relates to a method for operating a nonvolatile switching device comprising a laminate formed of a ferroelectric film and a semiconductor film.

BACKGROUND

Patent Literature 1 discloses a nonvolatile switching device. FIG. 8 shows the prior nonvolatile switching device disclosed in FIG. 3 of Patent Literature 1.

As shown in FIG. 8A, the nonvolatile switching device comprises a substrate 11, a control electrode 12, a ferroelectric layer 13, a semiconductor layer 14, and first to third electrodes 15a-15c. The control electrode 12, the ferroelectric layer 13, and the semiconductor layer 14 are stacked in this order on the substrate 11. The first to third electrodes 15a-15c are provided on the semiconductor layer 14.

A voltage is applied between the control electrode 12 and the first to third electrodes 15a-15c to change the polarization direction of the ferroelectric layer 13.

In a case where a portion of the ferroelectric layer 13 has upward polarization direction, the portion of the semiconductor layer 14 stacked on this portion of the ferroelectric layer 13 has low resistance. This corresponds to the ON-state.

On the contrary, in a case where a portion of the ferroelectric layer 13 has downward polarization direction, the portion of the semiconductor layer 14 stacked on this portion of the ferroelectric layer 13 has high resistance. This corresponds to the OFF-state.

In FIG. 8A, only the portion of the ferroelectric layer 13 positioned below the third electrode 15c has the downward polarization direction. Accordingly, as shown in FIG. 8B, a current flows selectively from the first electrode 15a to the second electrode 15b.

CITATION LIST

Patent Literature

[Patent Literature 1] US Pre-Grant Patent Application Publication No. 2009/0097299, which corresponds to Japanese laid-open patent publication No. 2009-099606.

SUMMARY OF DISCLOSURE

Technical Problem

FIG. 9A shows a variation of the nonvolatile switching device shown in FIG. 8.

In FIG. 9A, X direction, Y direction, and Z direction denote a longitudinal direction of the ferroelectric layer 13, the direction orthogonal to the longitudinal direction, and a stacking direction, respectively.

The nonvolatile switching device shown in FIG. 9A is identical to the one shown in FIG. 8 except that it comprises a first electrode 15, a second electrode 16, a third electrode 17, and a fourth electrode 18. These four electrodes 15-18 are disposed at the four positions corresponding to corners of a square.

The first electrode 15 and the third electrode 17 are provided along the X direction.

The second electrode 16 and the fourth electrode 18 are provided along the X direction.

The first electrode 15 and the second electrode 16 are provided along the Y direction.

The third electrode 17 and the fourth electrode 18 are provided along the Y direction.

A method for flowing a current selectively between two electrodes with use of the nonvolatile switching device is described below. Here, first, it is exemplified to flow a current selectively between the first electrode 15 and the third electrode 17.

Voltages are applied between the control electrode 12 and the first electrode 15 and between the control electrode 12 and the third electrode 17 to cause the respective portions of the ferroelectric layer 13 positioned under the first electrode 15 and the third electrode 17 to have the upward polarization direction. Thus, the respective portions have low-resistance states, namely, ON-states.

Alternatively, voltages are applied between the control electrode 12 and the second electrode 16 and between the control electrode 12 and the fourth electrode 18 to cause the respective portions of the ferroelectric layer 13 positioned under the second electrode 16 and the fourth electrode 18 to have the downward polarization direction. Thus, the respective portions have high-resistance states, namely, OFF-states.

Therefore, as shown in FIG. 9B, the current is flown selectively from the first electrode 15 to the third electrode 17. In other words, the current is flown neither to the second electrode 16 nor to the fourth electrode 18.

Next, it is exemplified to flow a current selectively between the first electrode 15 and the fourth electrode 18.

The application of voltage similar to above causes the respective portions of the ferroelectric layer 13 positioned below the first electrode 15 and the fourth electrode 18 to have the upward polarization direction. The respective portions of the ferroelectric layer 13 positioned below the third electrode 17 and the second electrode 16 is caused to have the downward polarization direction. Thus, the first electrode 15 and the fourth electrode 18 have ON-states, while the third electrode 17 and the second 16 have OFF-states. Therefore, in theory, a current can be flown selectively between the first electrode 15 and the fourth electrode 18.

However, in practice, a current flows between the first electrode 15 and the third electrode 17.

The reason is described below with reference to FIG. 10.

FIG. 10 is a top view of the first to fourth electrodes 15-18.

The length L1 between the first electrode 15 and the second electrode 16 is smaller than the length L2 between the first electrode 15 and the fourth electrode 18. Therefore, the resistance R1 between the first electrode 15 and the second electrode 16 is smaller than the resistance R2 between the first electrode 15 and the fourth electrode 18.

There are three electrical resistances between the first electrode 15 and the second electrode 16. Namely, these three resistances are low resistance $RL_{15}$, which is the resistance of the portion of the semiconductor layer 14 positioned under the first electrode 15, resistance R1, and high resistance $RH_{16}$, which is the resistance of the portion of the semiconductor layer 14 positioned under the second electrode 16.

Similarly, there are three electrical resistances between the first electrode 15 and the fourth electrode 18. Namely, these three resistances are low resistance $RL_{15}$, which is the resistance of the portion of the semiconductor layer 14 positioned under the first electrode 15, resistance R2, and low resistance $RL_{18}$, which is the resistance of the portion of the semiconductor layer 14 positioned under the fourth electrode 18.

Therefore, in order to flow a current selectively between the first electrode 15 and the fourth electrode 18, it is necessary that the following inequality (I) is satisfied.

$$RL_{15}+R1+RH_{16}>>RL_{15}+R2+RL_{18} \qquad (I)$$

Here, the mark ">>" means that the left value is much greater than the right value. Namely, "Value A>>Value B" means that the value A is much greater than the value B.

However, as described above, since R1 is smaller than R2, the inequality (I) is not always satisfied.

When $RH_{16}$ is not much greater than $RL_{18}$, $(R1+RH_{16})$ is not much greater than $(R2+RL_{18})$. Therefore, the inequality (I) is not satisfied. For this reason, although it is intended to flow a current selectively between the first electrode 15 and the fourth electrode 18, a current is flown between the first electrode 15 and the third electrode 17. This means that the nonvolatile switching device fails to operate accurately.

The purpose of the present disclosure is to provide a method for flowing a current selectively with use of a nonvolatile switching device operating accurately.

Solution to Problem

In order to accomplish above described purpose, one aspect of the present disclosure provides a method of flowing a current selectively with a nonvolatile switching device, the method comprising:

a step (a) of preparing the nonvolatile switching device, wherein the nonvolatile switching device comprises a control electrode, a ferroelectric film, a semiconductor film, and a electrode group, the control electrode, the ferroelectric film, the semiconductor film, and the electrode group are stacked in this order, the electrode group comprises a first electrode, a second electrode, and a third electrode, the first electrode comprises a side L2 with a length of LL and a side L3 with a length of LS, the second electrode comprises a side L4 with a length of LS and a side L6 with a length of LS, the third electrode comprises a side L7 with a length of LS and a side L8 with a length of LL, the sides L2, L3, and L6 are in parallel with the sides L8, L4, and L7, respectively, a following equation (A) is satisfied:

$$IL/LL=IS/LS \qquad (A)$$

wherein the IL denotes an interval between the sides L2 and L8, the IS denotes an interval between the sides L3 and L4, and the interval between the sides L6 and L7 is equal to the IS, a step (b) of configuring any one of a first state, a second state, and a third state into the nonvolatile switching device, wherein a current does not flow between the electrode group in the first state, a current flows selectively between the first electrode and the second electrode in the second state, a current flows selectively between the first electrode and the third electrode in the third state, voltages V1, Va, Vb, and Vc are applied to the control electrode, the first electrode, the second electrode, and the third electrode, respectively, when the first state is configured, voltages which satisfy any one of the following inequalities (a) to (d) are applied:

$$V1>Va, V1<Vb, \text{ and } V1<Vc \qquad (a)$$

$$V1<Va, V1>Vb, \text{ and } V1<Vc \qquad (b)$$

$$V1<Va, V1<Vb, \text{ and } V1>Vc \qquad (c),$$

or $$V1<Va, V1<Vb, \text{ and } V1<Vc \qquad (d)$$

when the second state is configured, voltages satisfying the following inequality set:

$$V1>Va, V1>Vb, \text{ and } V1<Vc$$

when the third state is configured, voltages satisfying the following inequality set are applied:

$$V1>Va, V1<Vb, \text{ and } V1>Vc.$$

In the method, the first electrode, the second electrode, and the third electrode may be congruent in a top view.

The method may further comprise the following step (c) between the step (a) and the step (b), a step (c) of applying voltage Vin to the first electrode, the second electrode, and the third electrode and applying voltage Vreset to the control electrode at the same time, wherein Vin<Vreset.

In the method, any one of the first state, the second state, and the third state, and a fourth state may be configured in the step (b), a current may flow between the first electrode, the second electrode, and the third electrode in the fourth state, when the fourth state is configured, voltages which satisfy the following inequality set may be applied:

$$V1>Va, V1>Vb, \text{ and } V1>Vc.$$

In the method, the nonvolatile switching device may further comprise a fourth electrode, the fourth electrode may comprise a side L10 with a length of the LS, a side L11 with a length of the LL, and a side L12 with a length of the LS, the first electrode may further comprise a side L1 with a length of the LS, the second electrode may further comprise a side L5 with a length of the LL, the third electrode may further comprises a side L9 with a length of the LS, the sides L1, L5, and L9 may be in parallel with the sides L12, L11 and L10, respectively, the interval between the sides L5 and L11 may be equal to the IL, both of the intervals between the sides L1 and L12 and between the sides L9 and L10 may be equal to the IS.

In the method, the first electrode, the second electrode, the third electrode, the fourth electrode may be congruent in a top view.

In the method, any one of the first state, the second state, the third state, and fourth to twelfth states may be configured in the step (b), an voltage Vd may be applied to the fourth electrode, a current may flow selectively between the first electrode, the second electrode, and the third electrode in the fourth state, when the fourth state is configured, voltages which satisfy the following inequality set may be applied:

$V1 > Va, V1 > Vb, V1 > Vc,$ and $V1 < Vd,$ a current may flow selectively between the second electrode and the third electrode in the fifth state,
when the fifth state is configured, voltages which satisfy the following inequality set may be applied:

$V1 < Va, V1 > Vb, V1 > Vc,$ and $V1 < Vd,$ a current may flow selectively between the first electrode and the fourth electrode in the sixth state,
when the sixth state is configured, voltages which satisfy the following inequality set may be applied:

$V1 > Va, V1 < Vb, V1 < Vc,$ and $V1 > Vd,$ a current may flow selectively between the second electrode and the fourth electrode in the seventh state,
when the seventh state is configured, voltages which satisfy the following inequality set may be applied:

$V1 < Va, V1 > Vb, V1 < Vc,$ and $V1 > Vd,$ a current may flow selectively between the third electrode and the fourth electrode in the eighth state,
when the eighth state is configured, voltages which satisfy the following inequality set may be applied:

$V1 < Va, V1 < Vb, V1 > Vc,$ and $V1 > Vd,$ a current may flow selectively between the first electrode, the second electrode, and the fourth electrode in the ninth state,
when the ninth state is configured, voltages which satisfy the following inequality set may be applied:

$V1 > Va, V1 > Vb, V1 < Vc$ and $V1 > Vd,$ a current may flow selectively between the first electrode, the third electrode, and the fourth electrode in the tenth state,
when the tenth state is configured, voltages which satisfy the following inequality set may be applied:

$V1 > Va, V1 < Vb, V1 > Vc$ and $V1 > Vd,$ a current may flow selectively between the second electrode, the third electrode, and the fourth electrode in the eleventh state,
when the eleventh state is configured, voltages which satisfy the following inequality set may be applied:

$V1 < Va, V1 > Vb, V1 > Vc$ and $V1 > Vd,$ a current may flow between the first electrode, the second electrode, the third electrode, and the fourth electrode in the twelfth state,
when the twelfth state is configured, voltages which satisfy the following inequality set may be applied:

$V1 > Va, V1 > Vb, V1 > Vc$ and $V1 > Vd.$

Advantageous Effects of Invention

The present disclosure provides a method for flowing a current selectively with use of a nonvolatile switching device operating accurately.

BRIEF DESCRIPTION OF DRAWINGS

FIG. 7 shows the result of the example 1.

DESCRIPTION OF EMBODIMENTS

The exemplary embodiments of the present disclosure are described below with reference to the drawings.

Embodiment 1

Figure 1:
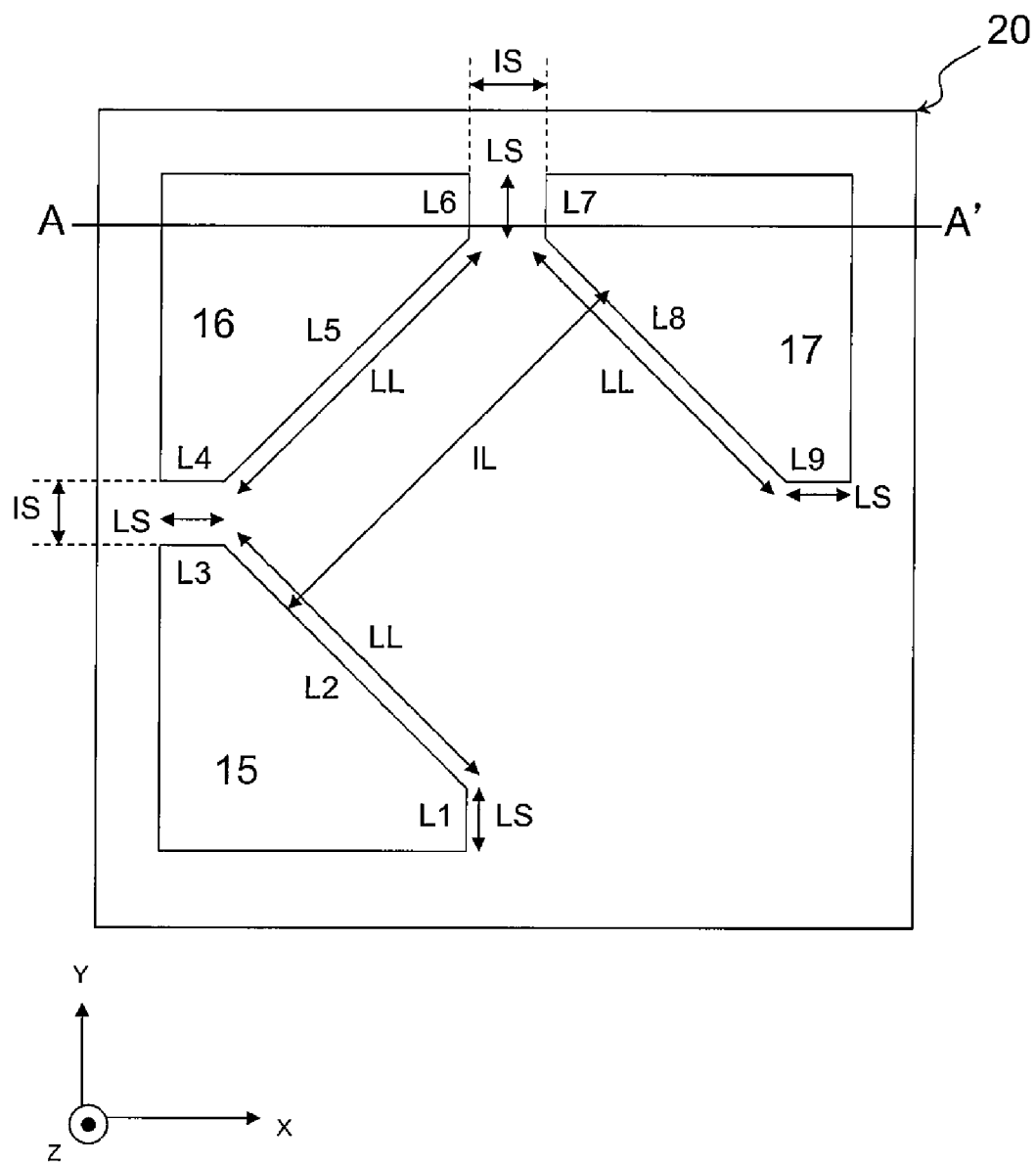
FIG. 1 shows a top view of the nonvolatile switching device according to the embodiment 1.
Figure 2:
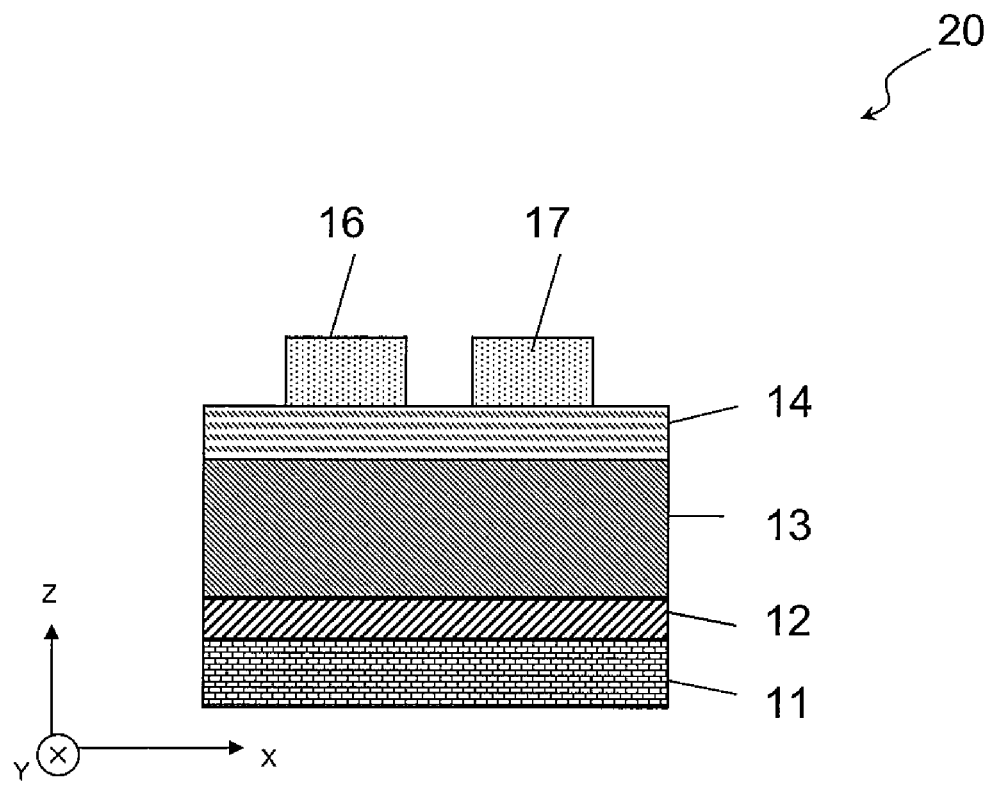
FIG. 2 shows a cross-sectional view of the nonvolatile switching device according to the embodiment 1.

FIG. 1 shows a top view of the nonvolatile switching device according to the embodiment 1. FIG. 2 shows the A-A' line cross-sectional view in FIG. 1.

As shown in FIG. 2, a control electrode 12, a ferroelectric film 13 and a semiconductor film 14 are stacked on a substrate 11.

As shown in FIG. 1 and FIG. 2, an electrode group is formed on the semiconductor film 14. The electrode group comprises a first electrode 15, a second electrode 16, and a third electrode 17. These electrodes 15-17 are disposed in such a manner that they are rotationally symmetric. These electrodes 15-17 are congruent in a top view.

As shown in FIG. 1 and FIG. 2, X-direction, Y-direction, and Z-direction denote the longitudinal direction of the ferroelectric film 13, the direction orthogonal to the longitudinal direction, and the stacking direction of the films 13-14, respectively. The term "top view" means viewing from the Z-direction.

The second electrode 16 is adjacent to the third electrode 17 along the X-direction.

The first electrode 15 is adjacent to the second electrode 16 along the Y-direction.

As shown in FIG. 1, the first electrode 15 comprises a side L1, a side L2, and a side L3. The second electrode 16 comprises a side L4, a side L5, and a side L6. The third electrode 17 comprises a side L7, a side L8, and a side L9.

The sides L1, L3, L4, L6, L7, and L9 have a length of LS each. The term "short side(s)" used in the present specification means these sides having the length LS. The sides L2, L5, and L8 have a length of LL each. The term "long side(s)" used in the present specification means these sides having the length LL.

The side L2 is parallel to the side L8. The interval between the side L2 and the side L8 is IL.
The side L3 is parallel to the side L4. The interval between the side L3 and the side L4 is IS.
The side L6 is parallel to the side L7. The interval between the side L6 and the side L7 is also IS.

In the embodiment 1, the following equation (A) is satisfied.

$$IL/LL = IS/LS \qquad (A)$$

Since the equation (A) is satisfied, the nonvolatile switching device according to the embodiment 1 operates accurately. The reason is described in more detail below.

In the nonvolatile logic circuit 20, the current flowing through the semiconductor film 14 is determined depending on the direction of the polarization in the ferroelectric film 13. Namely, when the polarization direction of the ferroelectric film 13 agrees with the +Z direction, the electrons induced in the semiconductor film 14 cause the semiconductor film 14 to have low resistance. On the contrary, when the polarization direction of the ferroelectric film 13 agrees with the −Z direction, the expulsion of the electrons from the semiconductor film 14 causes the semiconductor film 14 to have high resistance.

Voltages between each electrode 15-17 and the control electrode 12 are applied to determine the resistance value of the semiconductor film 14. As a result, the resistance values between the electrodes 15-17 are determined.

(Configuration Procedure of the Conductive Section in the Nonvolatile Logic Circuit 20)

Figure 3A:
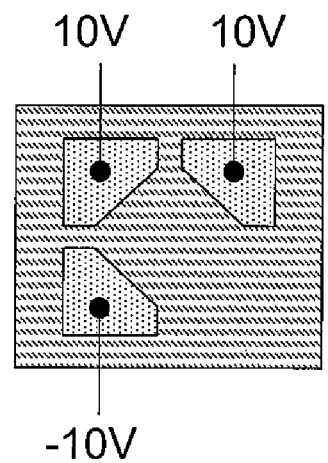
FIG. 3 shows an operating method of the nonvolatile switching device according to the embodiment 1.
Figure 3B:
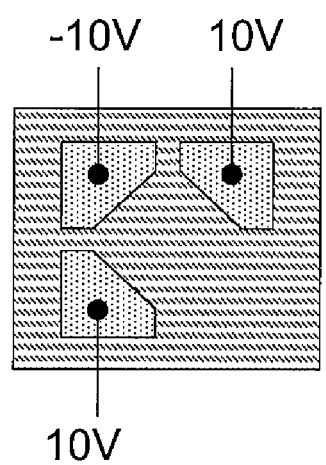
Figure 3C:
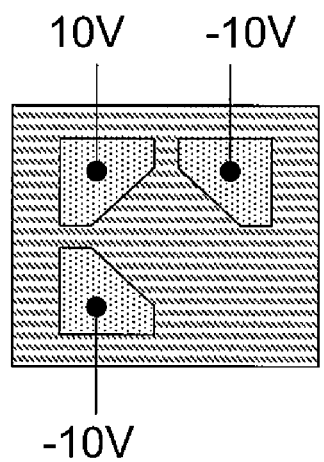
Figure 4:
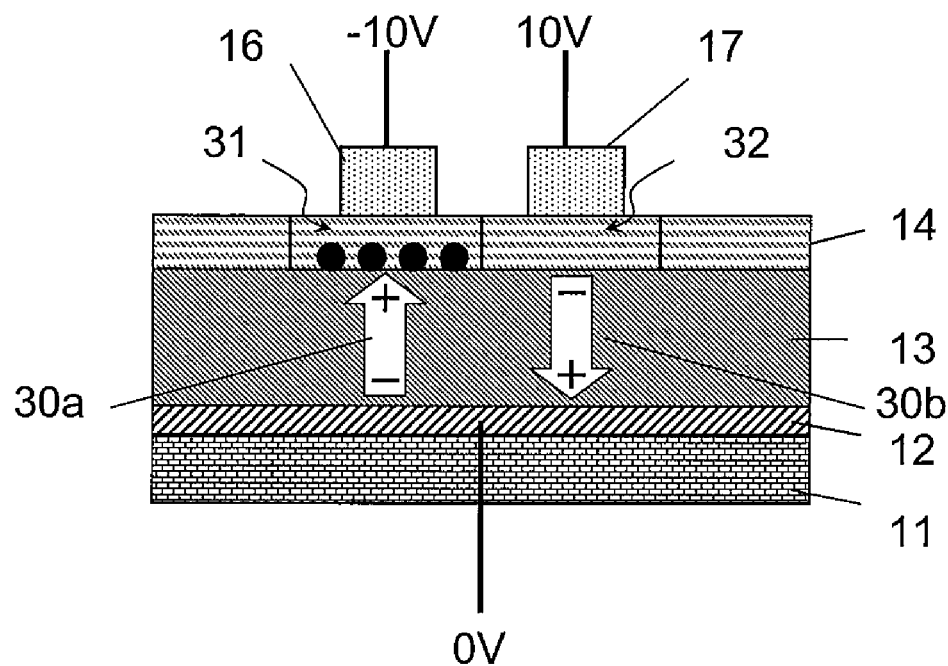
FIG. 4 shows low-resistance state and high-resistance state.
Figure 5:
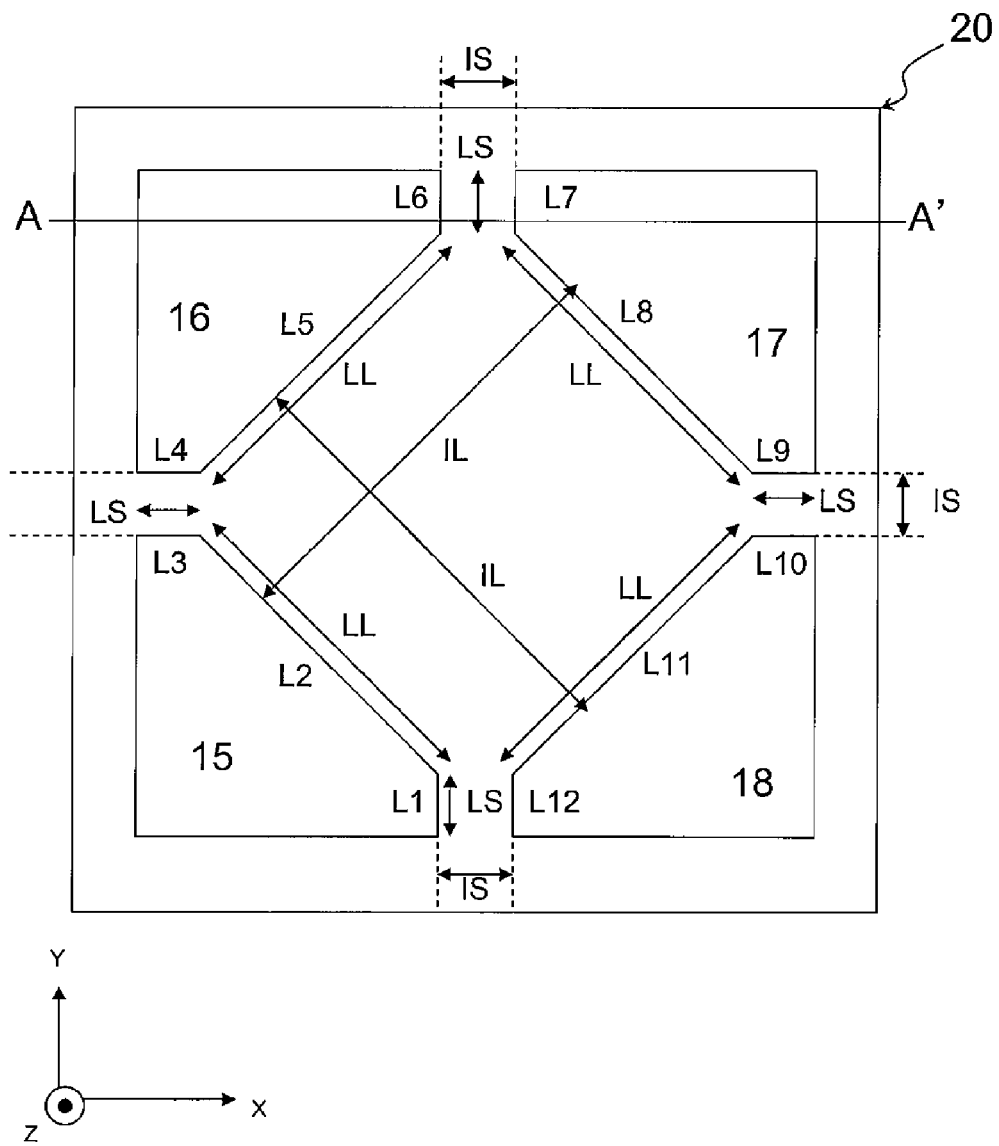
FIG. 5 shows a top view of the nonvolatile switching device according to the embodiment 2.

Next, with reference to FIG. 3, FIG. 4, and FIG. 5, the configuration procedure of the conduction section in the nonvolatile logic circuit 20 is described.

Three electrodes 15-17 are electrically connected or disconnected independently.

The following table 1 shows the conduction states between the first electrode 15 and the other electrodes 16-17 and the potentials of the electrodes 15-17. The voltage applied to the control electrode 12 is always constant. Preferably, the constant voltage is 0 volts.

TABLE 1

|  |  | First electrode 15 | Second electrode 16 | Third electrode 17 | Conductive Section |
|---|---|---|---|---|---|
| First state | (a) | −10 | 10 | 10 | None |
|  | (b) | 10 | −10 | 10 |  |
|  | (c) | 10 | 10 | −10 |  |
|  | (d) | 10 | 10 | 10 |  |
| Second state |  | −10 | −10 | 10 | between 15 and 16 |
| Third state |  | −10 | 10 | −10 | between 15 and 17 |

FIG. 3A to FIG. 3C show the potentials of the electrodes 15-17 in a top view. FIG. 3A, FIG. 3B, and FIG. 3C shows a first state, a second state, and a third state, respectively.

FIG. 4 shows the polarization condition of the ferroelectric film 13 and the condition of the semiconductor film 14 when the voltage of −10 volts and the voltage of 10 volts are applied to the second electrode 16 and the third electrode 17, respectively. The semiconductor 31 positioned below the input electrode 33, to which −10 volts is applied, has low resistance because of accumulation of electrons caused by the polarization 30a of the ferroelectric film 13. In contrast, the semiconductor 32 positioned below the input electrode 34, to which 10 volts is applied, has high resistance because the electrons have been expelled due to the polarization 30b of the ferroelectric film 13.

The procedures for configuring the first state, the second state, and the third state are described below.

Preferably, a reset operation is performed before the configuration. During the reset operation, a voltage Vin is applied to the electrodes 15-17, and a voltage Vreset, which satisfies the inequality Vin<Vreset, is applied to the control electrode 12. Specifically, it is preferred that 0 volts be applied to the electrodes 15-17 while 10 volts be applied to the control electrode 12. Thus, all of the polarization in the ferroelectric film 13 is configured to be upward.

The reset operation improves reproducibility of the switching operation.

During the configuration, V1, Va, Vb, and Vc are applied, respectively, to the control electrode 12, the first electrode 15, the second electrode 16, and the third electrode 17 to polarize the respective portions of the ferroelectric film 13 positioned below these electrodes 15-17. This polarization causes the respective portions of the semiconductor film 14 positioned below these electrodes 15-17 to have high or low resistance.

One state selected from the first state, the second state, and the third state is configured in the nonvolatile switching device 20.

In the first state, no current flows between the electrodes 15-17. When the first state is configured, the voltages V1, Va, Vb, and Vc which satisfy any one of the following inequality sets (a)-(d) are applied. In the first state, all the resistance values between electrodes 15-17 are high.

$V1>Va, V1<Vb$, and $V1<Vc$ (particularly, while $V1$ is maintained at 0 volts, $Va$ of −10 volts, $Vb$ of +10 volts, and $Vc$ of +10 volts are applied) (a)

$V1<Va, V1>Vb$, and $V1<Vc$ (particularly, while $V1$ is maintained at 0 volts, $Va$ of +10 volts, $Vb$ of −10 volts, and $Vc$ of +10 volts are applied) (b)

$V1<Va, V1<Vb$, and $V1>Vc$ (particularly, while $V1$ is maintained at 0 volts, $Va$ of +10 volts, $Vb$ of +10 volts, and $Vc$ of −10 volts are applied) (c)

$V1<Va, V1<Vb$, and $V1<Vc$ (particularly, while $V1$ is maintained at 0 volts, $Va$ of +10 volts, $Vb$ of +10 volts, and $Vc$ of +10 volts are applied) (d)

In the second state, a current flows selectively between the first electrode 15 and the second electrode 16. A current does not flow between the third electrode 17 and the first electrode 15. A current does not flow between the third electrode 17 and the second electrode 16, either. Namely, in the second state, the resistance value between the second electrode 16 and the first electrode 15 is low. The resistance values between the third electrode 17 and the other electrode 15-16 are high.

The phrase "A current flows selectively between Electrode A and Electrode B" means that a current flows only between the Electrode A and Electrode B and that a current does not flow between other electrodes. The term "selectively" is interpreted as above.

When the second state is configured, the voltages V1, Va, Vb, and Vc which satisfy the following inequalities are applied.

$V1>Va, V1>Vb$, and $V1<Vc$

Particularly, while V1 is maintained at 0 volts, Va of −10 volts, Vb of −10 volts, and Vc of +10 volts are applied.

In the third state, a current flows selectively between the first electrode 15 and the third electrode 17. A current does not flow between the second electrode 16 and the first electrode 15. A current does not flow between the second electrode 16 and the third electrode 17, either. Namely, in the third state, the resistance value between the first electrode 15 and the third electrode 17 is low. The resistance values between the second electrode 16 and the other electrodes 15/17 are high.

When the third state is configured, the voltages V1, Va, Vb, and Vc which satisfy the following inequalities are applied.

$V1>Va, V1<Vb$, and $V1>Vc$

Particularly, while V1 is maintained at 0 volts, Va of −10 volts, Vb of +10 volts, and Vc of −10 volts are applied.

As described above, in order to flow a current selectively between the first electrode 15 and the third electrode 17, it is necessary to satisfy the following inequality (I).

$$RL_{15}+R1+RH_{16} \gg RL_{15}+R2+RL_{17} \quad (I)$$

wherein $RL_{15}$: Low resistance, which is the resistance of the portion of the semiconductor layer 14 positioned under the first electrode 15, R1: Resistance between the first electrode 15 and the second electrode 16

$RH_{16}$: High resistance, which is the resistance of the portion of the semiconductor layer 14 positioned under the second electrode 16, R2: Resistance between the first electrode 15 and the third electrode 17

Figure 10:
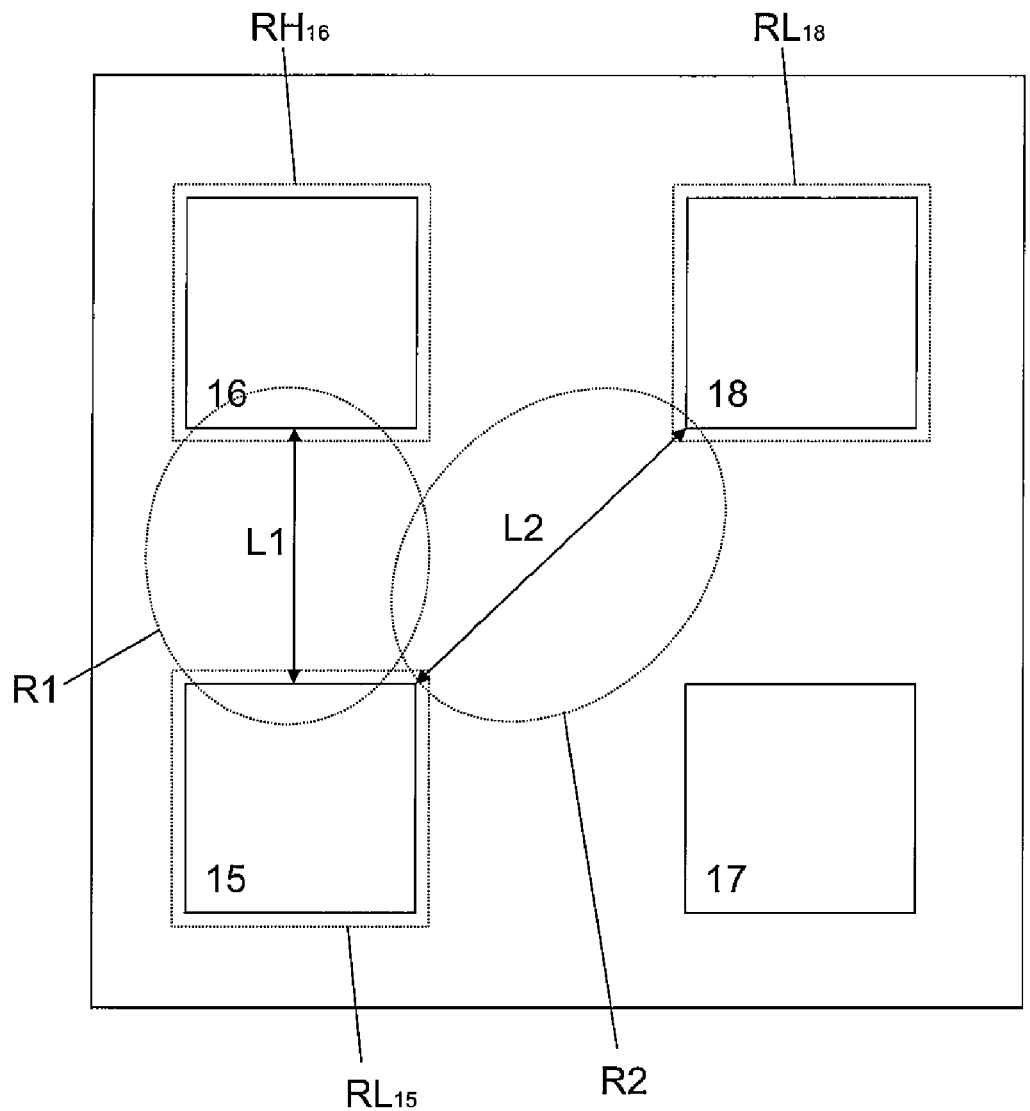
FIG. 10 shows the reason why the nonvolatile switching device shown in FIG. 9 fails to operate accurately.

$RL_{17}$: Low resistance, which is the resistance of the portion of the semiconductor layer 14 positioned under the third electrode 17, (See FIG. 10)

Since both of the left side and the right side of the inequality (I) has $RL_{15}$, each of $RL_{15}$ is subtracted from both of the left side and the right side of the inequality (I) to transform the inequality set (I) into the following inequality (II).

$$R1+RH_{16} \gg R2+RL_{17} \quad (II)$$

In the present embodiment, the equality: IL/LL=IS/LS is satisfied. Since the resistance is proportional to the length (IL and IS), and inversely proportional to the cross-sectional area (LL and LS), R2 is equal to R1.

Therefore, the following inequality (II) is transformed into the following inequality (III).

$$RH_{16} \gg RL_{17} \quad (III)$$

Since the inequality set (III) is always satisfied, the inequality (I) is also always satisfied. In this manner, a current flows selectively between the first electrode 15 and the third electrode 17.

In the embodiment 1, as shown in the following Table 2, all the sections between the first electrode 15, the second electrode 16, and the third electrode 17 can be conductive, namely, can be electrically connected. This state is referred to as the "fourth state".

TABLE 2

| | First electrode 15 | Second electrode 16 | Third electrode 17 | Conductive Sections |
|---|---|---|---|---|
| Fourth state | −10 | −10 | −10 | between 15-16 between 16-17, and between 17-15 |

In the fourth state, all the resistance values of the sections between the electrodes 15-17 are low.

When the fourth state is configured, the voltages V1, Va, Vb, and Vc which satisfy the following inequalities are applied.

$$V1>Va, V1>Vb, \text{ and } V1>Vc$$

Particularly, while V1 is maintained at 0 volts, Va of −10 volts, Vb of −10 volts, and Vc of −10V are applied.

Embodiment 2

FIG. 5 shows a top view of the nonvolatile switching device according to an embodiment 2.

Unlike the nonvolatile switching device according to the embodiment 1, a fourth electrode 18 is formed on the semiconductor film 14. The electrodes 15-18 are disposed in such a manner that they are rotationally symmetric. The electrodes 15-18 are congruent in a top view.

As shown in FIG. 5, the fourth electrode 18 comprises a side L10 having a length of LS, a side L11 having a length of LL, and a side L12 having a length of LS.

The side L11 is parallel to the side L5. The interval between the side L11 and the side L5 is equal to IL.

The side L10 and the side L12 are parallel to the side L9 and L1, respectively. The intervals between these sides are equal to IS.

In the second embodiment 2, the following equality (A) is satisfied.

$$IL/LL=IS/LS \quad (A)$$

Figure 6:
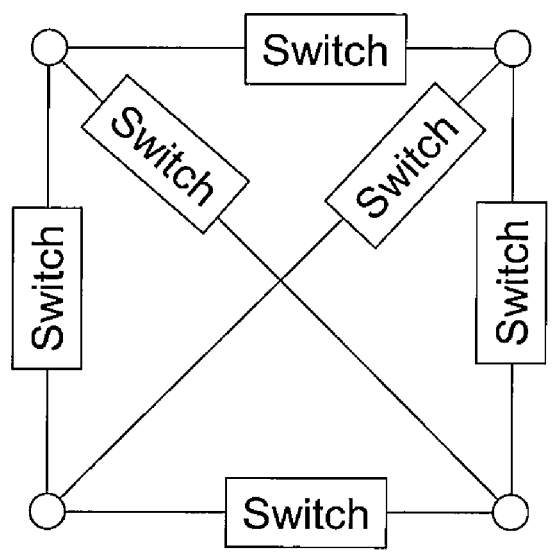
FIG. 6 shows an electrical circuit of the nonvolatile switching device according to the embodiment 2.
Figure 8A:
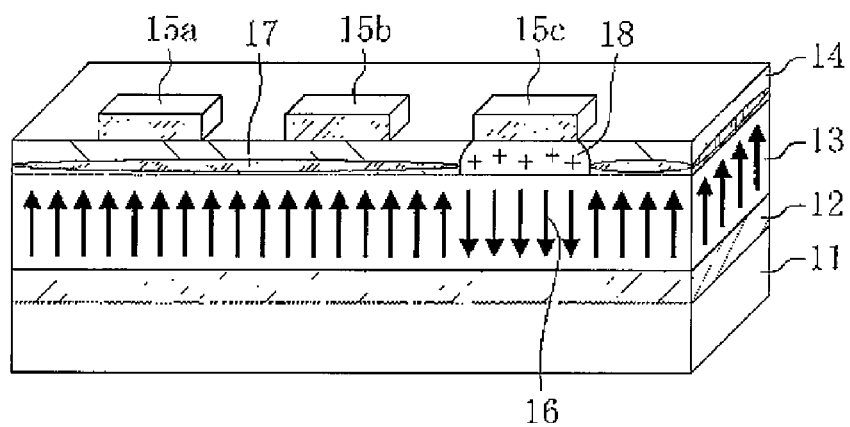
FIG. 8 shows the nonvolatile switching device disclosed in Patent Literature 1.
Figure 8B:
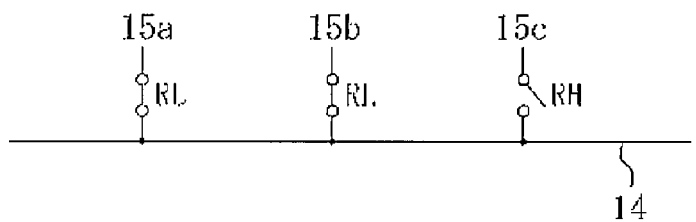
Figure 9A:
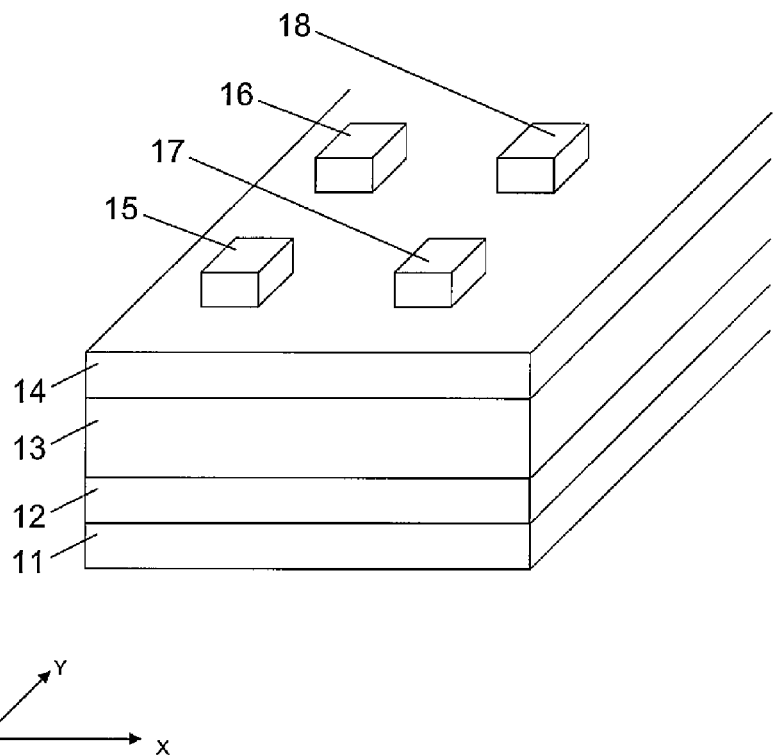
FIG. 9 shows a variation of the nonvolatile switching device shown in FIG. 8.
Figure 9B:
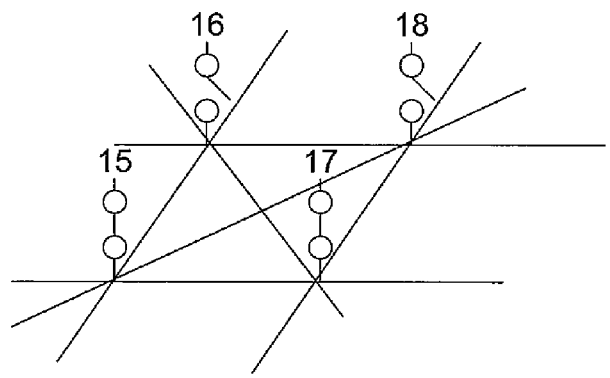

Therefore, similarly to the reason described in the embodiment 1, as shown in FIG. 6, a current flows selectively between the electrodes 15-18.

(Configuration Procedure of the Conductive Section in the Nonvolatile Logic Circuit 20)

Next, the configuration procedure of the conduction section in the nonvolatile logic circuit 20 is described.

The four electrodes 15-18 are electrically connected or disconnected independently.

The following table 3 shows the voltages of the electrodes 15-18 when the conductive states between the electrodes 15-18 are varied. The voltage applied to the control electrode 12 is always constant. Preferably, the constant voltage is 0 volts.

TABLE 3

| | | First electrode 15 | Second electrode 16 | Third electrode 17 | Fourth electrode 18 | Conductive Section |
|---|---|---|---|---|---|---|
| First state | (a) | −10 | 10 | 10 | 10 | None |
| | (b) | 10 | −10 | 10 | 10 | |
| | (c) | 10 | 10 | −10 | 10 | |
| | (d) | 10 | 10 | 10 | −10 | |
| | (e) | 10 | 10 | 10 | 10 | |
| Second state | | −10 | −10 | 10 | 10 | between 15 and 16 |
| Third state | | −10 | 10 | −10 | 10 | between 15 and 17 |
| Fourth state | | −10 | −10 | −10 | 10 | between 15-16, between 16-17, and between 17-15 |
| Fifth state | | 10 | −10 | −10 | 10 | between 16 and 17 |
| Sixth state | | −10 | 10 | 10 | −10 | between 15 and 18 |
| Seventh state | | 10 | −10 | 10 | −10 | between 16 and 18 |
| Eighth state | | 10 | 10 | −10 | −10 | between 17 and 18 |
| Ninth state | | −10 | −10 | 10 | −10 | between 15-16, between 16-18, and between 18-15 |
| Tenth state | | −10 | 10 | −10 | −10 | between 15-17, between 17-18, and between 18-15 |

TABLE 3-continued

| | First electrode 15 | Second electrode 16 | Third electrode 17 | Fourth electrode 18 | Conductive Section |
|---|---|---|---|---|---|
| Eleventh state | 10 | −10 | −10 | −10 | between 16-17, between 17-18, and between 18-16 |
| Twelfth state | −10 | −10 | −10 | −10 | All |

The reset operation is also preferred in the embodiment 2.

During configuration, V1, Va, Vb, Vc, and Vd are applied, respectively, to the control electrode 12, the first electrode 15, the second electrode 16, the third electrode 17, and the fourth electrode 18 to polarize the respective portions of the ferroelectric film 13 positioned below these electrodes 15-18. This polarization causes the respective portions of the semiconductor film 14 positioned below these electrodes 15-18 to have high or low resistance.

One state selected from the first to twelfth states is configured in the nonvolatile switching device 20.

The first to fourth states of the embodiment 2 are identical to those of the embodiment 1.

In the fifth state, a current flows selectively between the second electrode 16 and the third electrode 17. When the fifth state is configured, the voltages V1, Va, Vb, Vc, and Vd which satisfy the following inequality set are applied.

$V1<Va, V1>Vb, V1>Vc,$ and $V1<Vd$

Particularly, while V1 is maintained at 0 volts, Va of +10 volts, Vb of −10 volts, Vc of −10 volts, and Vd of +10 volts are applied.

In the sixth state, a current flows selectively between the first electrode 15 and the fourth electrode 18. When the sixth state is configured, the voltages V1, Va, Vb, Vc, and Vd which satisfy the following inequality set are applied.

$V1>Va, V1<Vb, V1<Vc,$ and $V1>Vd$

Particularly, while V1 is maintained at 0 volts, Va of −10 volts, Vb of +10 volts, Vc of +10 volts, and Vd of −10 volts are applied.

In the seventh state, a current flows selectively between the second electrode 16 and the fourth electrode 18. When the seventh state is configured, the voltages V1, Va, Vb, Vc, and Vd which satisfy the following inequality set are applied.

$V1<Va, V1>Vb, V1<Vc,$ and $V1>Vd$

Particularly, while V1 is maintained at 0 volts, Va of +10 volts, Vb of −10 volts, Vc of +10 volts, and Vd of −10 volts are applied.

In the eighth state, a current flows selectively between the third electrode 17 and the fourth electrode 18. When the eighth state is configured, the voltages V1, Va, Vb, Vc, and Vd which satisfy the following inequality set are applied.

$V1<Va, V1<Vb, V1>Vc,$ and $V1>Vd$

Particularly, while V1 is maintained at 0 volts, Va of +10 volts, Vb of +10 volts, Vc of −10 volts, and Vd of −10 volts are applied.

In the ninth state, a current flows selectively between the first electrode 15, the second electrode 16 and the fourth electrode 18. When the ninth state is configured, the voltages V1, Va, Vb, Vc, and Vd which satisfy the following inequality set are applied.

$V1>Va, V1>Vb, V1<Vc,$ and $V1>Vd$

Particularly, while V1 is maintained at 0 volts, Va of −10 volts, Vb of −10 volts, Vc of +10 volts, and Vd of −10 volts are applied.

In the tenth state, a current flows selectively between the first electrode 15, the third electrode 17 and the fourth electrode 18. When the tenth state is configured, the voltages V1, Va, Vb, Vc, and Vd which satisfy the following inequality set are applied.

$V1>Va, V1<Vb, V1>Vc,$ and $V1>Vd$

Particularly, while V1 is maintained at 0 volts, Va of −10 volts, Vb of +10 volts, Vc of −10 volts, and Vd of −10 volts are applied.

In the eleventh state, a current flows selectively between the second electrode 16, the third electrode 17 and the fourth electrode 18. When the eleventh state is configured, the voltages V1, Va, Vb, Vc, and Vd which satisfy the following inequality set are applied.

$V1<Va, V1>Vb, V1>Vc,$ and $V1>Vd$

Particularly, while V1 is maintained at 0 volts, Va of +10 volts, Vb of −10 volts, Vc of −10 volts, and Vd of −10 volts are applied.

In the twelfth state, a current flows between all the electrodes 15-18. When the twelfth state is configured, the voltages V1, Va, Vb, Vc, and Vd which satisfy the following inequality set are applied.

$V1>Va, V1>Vb, V1>Vc,$ and $V1>Vd$

Particularly, while V1 is maintained at 0 volts, Va of −10 volts, Vb of −10 volts, Vc of −10 volts, and Vd of −10 volts are applied.

Example

The present disclosure is described below in further detail with reference to the following example.

(1) The control electrode 12 was formed on the substrate 11 covered by a silicon oxide film in accordance with the following procedure. A Ti film with a thickness of 5 nanometers and a Pt film with a thickness of 30 nanometers were formed in this order by electron gun deposition method. Next, a SrRuO$_3$ (hereinafter, referred to as "SRO") film with a thickness of 10 nanometers was formed by pulse laser deposition method.

(2) The substrate was heated to 700 degrees Celsius, and the ferroelectric film 13 consisted of Pb(Zr,Ti)O$_3$ with a thickness of 450 nanometers was formed by pulse laser deposition method.

(3) The substrate temperature was set at 400 degrees Celsius, and the semiconductor film 14 consisted of ZnO with thickness of 30 nanometers was formed.

(4) A resist pattern was formed on the semiconductor film 14 with use of photolithography. Subsequently, the portion of the semiconductor film 14 which the resist pattern did not cover was removed by etching with use of nitric acid.

(5) Subsequently, the resist on the semiconductor film 14 was patterned with use of photolithography. A Ti film with a thickness of 5 nanometers and a Pt film with a thickness of 30 nanometers were formed by electron gun deposition method. The resist was removed to form the electrodes 15-18 shown in FIG. 5.

LS, IS, LL, and IL were 10 micrometers, 8 micrometers, 63 micrometers, and 51 micrometers, respectively. IL/LL=IS/LS=approximately 0.8.

The first, second, third, and six states were configured in the obtained nonvolatile switching device based on Table 3.

Subsequently, a voltage of 0.1 volts was applied between the first electrode 15 and the other electrodes 16-18 to measure the current flowing between the first electrode 15 and the other electrodes 16-18. The resistance value of the nonvolatile switching device was calculated from the measured current values.

FIG. 7 shows the resistance values calculated in first, second, third, and six states. As understood from FIG. 7, the resistance values between all the electrodes are high in the first states. In the second state, the resistance value is low between the first electrode 15 and the second electrode 16. In the third state, the resistance value is low between the first electrode 15 and the third electrode 17. In the sixth state, the resistance value is low between the first electrode 15 and the fourth electrode 18.

In the present example, the control electrode 12 consisted of a laminate of SRO/Pt/Ti and the electrode 15-18 consisted of a laminate of Pt/Ti were used. A laminate consisting of other materials may be also used.

As the material of the ferroelectric film 13, other ferroelectric materials such as, but not limited to, $Sr(Bi,Ta)O_x$ or $BiTiO_x$ may also be used. As the material of the semiconductor 14, other semiconductor materials such as, but not limited to, GaN or $InGaZnO_x$ may also be used.

INDUSTRIAL APPLICABILITY

The present disclosure provides a method for flowing a current selectively with use of a nonvolatile switching device operating accurately.

REFERENCE SIGNS LIST

11: substrate
12: control Electrode
13: ferroelectric film
14: semiconductor film
15: first electrode
16: second electrode
17: third electrode
18: fourth electrode
20: nonvolatile logic circuit
30a: upward polarization in the ferroelectric film 13
30b: Downward polarization in the ferroelectric film 13
31: Low resistant portion in the semiconductor film 14
32: High resistant portion in the semiconductor film 14

The invention claimed is:

1. A method of flowing a current selectively with a nonvolatile switching device, the method comprising:
a step (a) of preparing the nonvolatile switching device, wherein
the nonvolatile switching device comprises a control electrode, a ferroelectric film, a semiconductor film, and a electrode group,
the control electrode, the ferroelectric film, the semiconductor film, and the electrode group are stacked in this order,
the electrode group comprises a first electrode, a second electrode, and a third electrode,
the first electrode comprises a side L2 with a length of LL and a side L3 with a length of LS,
the second electrode comprises a side L4 with a length of LS and a side L6 with a length of LS,
the third electrode comprises a side L7 with a length of LS and a side L8 with a length of LL,
the sides L2, L3, and L6 are in parallel with the sides L8, L4, and L7, respectively,
a following equation (A) is satisfied:

$$IL/LL = IS/LS \tag{A}$$

wherein
the IL denotes an interval between the sides L2 and L8,
the IS denotes an interval between the sides L3 and L4, and
the interval between the sides L6 and L7 is equal to the IS,
a step (b) of configuring any one of a first state, a second state, and a third state into the nonvolatile switching device, wherein
a current does not flow between the electrode group in the first state,
a current flows selectively between the first electrode and the second electrode in the second state,
a current flows selectively between the first electrode and the third electrode in the third state,
voltages V1, Va, Vb, and Vc are applied to the control electrode, the first electrode, the second electrode, and the third electrode, respectively,
when the first state is configured, voltages which satisfy any one of the following inequality set (a) to (d) are applied:

$$V1 > Va, V1 < Vb, \text{ and } V1 < Vc \tag{a}$$

$$V1 < Va, V1 > Vb, \text{ and } V1 < Vc \tag{b}$$

$$V1 < Va, V1 < Vb, \text{ and } V1 > Vc \tag{c, or}$$

$$V1 < Va, V1 < Vb, \text{ and } V1 < Vc \tag{d}$$

when the second state is configured, voltages satisfy the following inequality set:

$$V1 > Va, V1 > Vb, \text{ and } V1 < Vc$$

when the third state is configured, voltages satisfy the following inequality set are applied:

$$V1 > Va, V1 < Vb, \text{ and } V1 > Vc.$$

2. The method of claim 1, wherein the first electrode, the second electrode, and the third electrode are congruent in a top view.

3. A method of claim 1, further comprising the following step (c) between the step (a) and the step (b),
a step (c) of applying voltage Vin to the first electrode, the second electrode, and the third electrode and applying voltage Vreset to the control electrode at the same time, wherein Vin<Vreset.

4. A method of claim 1, wherein any one of the first state, the second state, and the third state, and a fourth state is configured in the step (b),
a current flows between the first electrode, the second electrode, and the third electrode in the fourth state,
when the fourth state is configured, voltages which satisfy the following inequality set are applied:

$$V1 > Va, V1 > Vb, \text{ and } V1 > Vc.$$

5. A method of claim 3, wherein the nonvolatile switching device further comprises a fourth electrode, wherein
the fourth electrode comprises a side L10 with a length of the LS, a side L11 with a length of the LL, and a side L12 with a length of the LS,
the first electrode further comprises a side L1 with a length of the LS,
the second electrode further comprises a side L5 with a length of the LL, the third electrode further comprises a side L9 with a length of the LS, the sides L1, L5, and L9 are in parallel with the sides L12, L11 and L10, respectively, then interval between the sides L5 and L11 is equal to the IL, both of the intervals between the sides L1 and L12 and between the sides L9 and L10 are equal to the IS.

6. A method of claim 5, wherein the first electrode, the second electrode, the third electrode, the fourth electrode are congruent in a top view.

7. A method of claim 5, wherein any one of the first state, the second state, the third state, and fourth to twelfth states in the step (b), wherein an voltage Vd is applied to the fourth electrode, a current flows selectively between the first electrode, the second electrode, and the third electrode in the fourth state, when the fourth state is configured, voltages which satisfy the following inequality set are applied:

$V1>Va, V1>Vb, V1>Vc,$ and $V1<Vd,$ a current flows selectively between the second electrode and the third electrode in the fifth state, when the fifth state is configured, voltages which satisfy the following inequality set are applied:

$V1<Va, V1>Vb, V1>Vc,$ and $V1<Vd,$ a current flows selectively between the first electrode and the fourth electrode in the sixth state, when the sixth state is configured, voltages which satisfy the following inequality set are applied:

$V1>Va, V1<Vb, V1<Vc,$ and $V1>Vd,$ a current flows selectively between the second electrode and the fourth electrode in the seventh state, when the seventh state is configured, voltages which satisfy the following inequality set are applied:

$V1<Va, V1>Vb, V1<Vc,$ and $V1>Vd,$ a current flows selectively between the third electrode and the fourth electrode in the eighth state, when the eighth state is configured, voltages which satisfy the following inequality set are applied:

$V1<Va, V1<Vb, V1>Vc,$ and $V1>Vd,$ a current flows selectively between the first electrode, the second electrode, and the fourth electrode in the ninth state, when the ninth state is configured, voltages which satisfy the following inequality set are applied:

$V1>Va, V1>Vb, V1<Vc$ and $V1>Vd,$ a current flows selectively between the first electrode, the third electrode, and the fourth electrode in the tenth state, when the tenth state is configured, voltages which satisfy the following inequality set are applied:

$V1>Va, V1<Vb, V1>Vc$ and $V1>Vd,$ a current flows selectively between the second electrode, the third electrode, and the fourth electrode in the eleventh state, when the eleventh state is configured, voltages which satisfy the following inequality set are applied:

$V1<Va, V1>Vb, V1>Vc$ and $V1>Vd,$ a current flows between the first electrode, the second electrode, the third electrode, and the fourth electrode in the twelfth state, when the twelfth state is configured, voltages which satisfy the following inequality set are applied:

$V1>Va, V1>Vb, V1>Vc$ and $V1>Vd.$

* * * * *